United States Patent
Fujiura et al.

(10) Patent No.: US 7,674,737 B2
(45) Date of Patent: Mar. 9, 2010

(54) OPTICAL MEDIUM, AN OPTICAL LENS AND A PRISM

(75) Inventors: Kazuo Fujiura, Atsugi (JP); Tadayuki Imai, Atsugi (JP); Masahiro Sasaura, Atsugi (JP); Kouichirou Nakamura, Yokohama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 47 days.

(21) Appl. No.: 10/599,452

(22) PCT Filed: Jun. 22, 2005

(86) PCT No.: PCT/JP2005/011433

§ 371 (c)(1),
(2), (4) Date: Sep. 28, 2006

(87) PCT Pub. No.: WO2005/124398

PCT Pub. Date: Dec. 29, 2005

(65) Prior Publication Data

US 2007/0199505 A1    Aug. 30, 2007

(30) Foreign Application Priority Data

Jun. 22, 2004    (JP) .............................. 2004-183966

(51) Int. Cl.
 C04B 35/00    (2006.01)
 G02B 3/00    (2006.01)
 G02B 7/00    (2006.01)
 G02B 9/00    (2006.01)
 G02B 5/04    (2006.01)
 G02B 7/18    (2006.01)

(52) U.S. Cl. ..................... 501/134; 117/902; 117/918; 117/948; 359/642; 359/831

(58) Field of Classification Search .................. 359/717, 359/719, 642, 831; 501/134; 117/217, 902, 117/918, 948

See application file for complete search history.

(56) References Cited

U.S. PATENT DOCUMENTS 5,785,898 A * 7/1998 Hofmeister et al. ......... 252/584

(Continued)

FOREIGN PATENT DOCUMENTS

EP    1039315 A2    9/2000

(Continued)

OTHER PUBLICATIONS

Maciolek et al. Growth of potassium tantalate dielectric crystals and their application as photovoltaic UV detectors. Electron Devices Meeting, 1973 International. vol. 19, p. 96-98. Publication Date: 1973.*

(Continued)

Primary Examiner—Karl E Group
Assistant Examiner—Noah S Wiese
(74) Attorney, Agent, or Firm—Workman Nydegger

(57) ABSTRACT

An optical medium having a high refractive index without anisotropy and a wide transmission wavelength is obtained. The cubic crystal material is $\alpha\beta O_3$, where $\alpha$ is at least one of K, Ba, Sr, Ca, and $\beta$ is at least one of Ta, Ti. Optimally, the cubic crystal material is $KTa_{1-x}Nb_xO_3$, where composition x is $0 \leq x \leq 0.35$. This composition enables to raise refractive index while its phase transition temperature is below a room temperature.

3 Claims, 9 Drawing Sheets

U.S. PATENT DOCUMENTS

| | | | |
|---|---|---|---|
| 6,043,940 A * | 3/2000 | Kamiyama et al. | 359/719 |
| 6,559,084 B1 * | 5/2003 | Fujikawa et al. | 501/139 |
| 6,795,232 B2 * | 9/2004 | Fujiura et al. | 359/326 |
| 7,268,549 B2 * | 9/2007 | Geifman et al. | 324/316 |
| 2003/0128440 A1 * | 7/2003 | Kimura | 359/717 |
| 2005/0062011 A1 * | 3/2005 | Geifman et al. | 252/62 |

FOREIGN PATENT DOCUMENTS

| | | |
|---|---|---|
| EP | 1659445 A1 | 5/2006 |
| JP | 07-082087 | 3/1995 |
| JP | 08190020 | 7/1996 |
| JP | 2000-019301 | 1/2000 |
| JP | 2002-296632 | 10/2002 |
| JP | 2003-123302 | 4/2003 |
| JP | 2003-167187 | 6/2003 |

OTHER PUBLICATIONS

R.A. Swalin, *Thermodynamics of Solids*, Chapter 15, "Defects in Compounds," John Wiley & Sons, Inc., New York (1962), pp. 272-321.

Imai, Tadayuki et al., *Introducing Protons into Potassium Tantalate Niobate Single Crystals*, Jpn J. Appl. Phys., vol. 38 (1999), pp. 729-736.

Yukio Kurata, *Trends of Large-Capacity Optical Disk*, vol. 72, Dec. 1998, pp. 9-12.

* cited by examiner

OPTICAL MEDIUM, AN OPTICAL LENS AND A PRISM

TECHNICAL FIELD

The present invention relates to an optical medium, an optical lens and a prism, and more particularly relates to an optical medium, an optical lens and a prism having a high refractive index without anisotropy and a wide passband.

BACKGROUND ART

Conventionally, optical components such as an optical lens and a prism are used for optical apparatuses such as a camera, a microscope and a telescope; electronograph system recording apparatuses such as a printer and a copier; an optical recording medium such as DVD; and an optical device. For example, it is necessary to make the beam diameter of a laser beam for recording as small as possible so as to raise recording density in the field of an optical recording. Thus, in order to focus shorter wavelength light efficiently, a lens and a prism that retain high optical transmittance to a short wavelength band with a high refractive index, without anisotropy, is necessary.

For example, the beam spot diameter of a laser beam is determined by a wavelength $\lambda$ of a light source and a numeric aperture NA of a lens, and is known as $0.8 \times \lambda/NA$. An information capacity of 4.7 GB can be recorded in a conventional DVD recording apparatus having a 5-inch disk using a semiconductor laser with a 650 nm wavelength and a lens having NA=0.6. Recently, DVD (Blu-ray) recording apparatuses with enlarged NA and decreased wavelength have been developed. These apparatuses have realized a storage capacity of about 23 GB in a 5-inch disk using a semiconductor laser with a 405 nm wavelength and a lens having NA=0.85 as a light source.

Additionally, a near field recording method is known to raise recording density by Evanescent light at the reflecting surface using a minute lens with a high refractive index. This minute lens is a hemispheric lens called SIL (Solid Immersion Lens) and is placed between an optical recording medium and an objective lens. In such an optical system, the beam spot diameter of a laser beam transmitted through the objective lens equivalently becomes $\lambda/(n k \times NA)$ (n is the refractive index of a SIL) and can focus to 1/n compared to those without a SIL. (e.g., See Nonpatent Document 1). In the area where the gap between the recording surface of the optical recording medium and the bottom surface of the SIL is below ¼ of the light wavelength, a laser beam transmitted through the SIL is outputted in a same disposition as an interior of the SIL. Then, the beam spot diameter is focus to 1/n of a diffraction limit.

Above referenced SIL becomes $NA=n^2 \sin \theta$ when incident angle is $\theta$ and has a great influence on the refractive index of an optical medium. For this reason, the optical medium with a high refractive index is crucial and an isotropic optical medium without birefringence is crucial at focal power. In addition, it is important to be an optical medium whose optical transmittance does not deteriorate to the short wavelength band. Beside a SIL, optical components such as a camera, a microscope and a stepper have implemental constraint and, a small lens with a high refractive index and high focal power is necessary. If the lens is of the same size, large NA, high focal power and bright lens is preferable. In the same way, a prism may be realized small and sufficient spectroscopic characterization by using high refractive index materials.

Concerning the above mentioned viewpoint, high refractive index glasses and crystal materials have been examined. For the glasses, high refractive index glasses containing much La and Pb, and $TeO_2$-based glasses are known. However, an optical medium that can realize a refractive index of 2.2 in a visible wavelength band has not been developed. There is a problem in that optical transmittance at around 400 nm deteriorates by raising refractive index.

Meanwhile, concerning the crystal materials, a lot of lenses with a high refractive index have been developed by using oxide crystals (e.g., See Patent Document 1). However, optically isotropic materials without birefringence are limited to cubic crystal structure. Although, many crystals are disclosed in the Patent Document 1, isotopic materials are limited to $SrNbO_3$, $SrTaO_3$, $Bi_{20}SiO_{12}$, $Bi_{20}GeO_{12}$, $Bi_4Ge_3O_{12}$ and GaP. Concerning these crystals, the refractive index in the visible wavelength band is from 2.06 to 2.22.

In addition, high-intensity liquid crystal projectors require a prism for a polarization optical system, which has high optical transmittance of the visible wavelength band without anisotropy of refractive index, and has a high refractive index. Although borosilicate glasses were used conventionally, there was a disadvantage that photo-elastic effect is large. Thus, it is examined to use high refractive index glasses such as lead-containing glasses. However, there has been a problem that these glasses have low transmittance in the short wavelength band, and cannot be used in the wavelength band used for the liquid crystal projector.

Furthermore, an air pollution measuring device has no absorption up to a long wavelength band of around 5 µm, and requires optical materials with a high refractive index. Conventionally, optical transmittance in the long wavelength band of the optical medium is as follows. An optical transmission range of silica based glasses is up to around 2 µm and silica based glasses have a low refractive index. Fluoride glasses such as ZBLAN ($ZrF_4$—$BaF_2$—$LaF_3$—$AlF_3$—$NaF$) have high optical transmittance but the refractive index is low around 1.5. Calcogenite glasses such as Ge—Sb—Se have high optical transmittance but have problem in toxicity. Therefore, optical medium with high optical transmittance in the long wavelength band and a high refractive index is required.

Patent Document 1: Japanese Patent Application Laying-Open No. 2000-19301

Nonpatent Document 1: Sharp Technical Report "Trend of high-capacity optical disk" Vol. 72, December, 1998, pp. 9-12

DISCLOSURE OF THE INVENTION

An object of the present invention is to provide an optical medium, an optical lens and a prism having a high refractive index without anisotropy and a wide passband.

In order to accomplish such the object, an optical medium of the present invention consists of a cubic crystal material. The crystal material is $\alpha\beta O_3$, where $\alpha$ is at least one of K, Ba, Sr, Ca, and $\beta$ is at least one of Ta, Ti. For example, when $\alpha$ is K, and $\beta$ is Ta, a high refractive index of 2.2-2.4 in a visible wavelength band without birefringence in a wide temperature range can be attained. Additionally, the crystal material is $KTaO_{3-d}$, where the amount of oxygen deficiency d is $0 \leq d < 10^{-7}$.

In other aspect, the crystal material is $KTa_{1-x}Nb_xO_3$, where composition x is $0 \leq x \leq 0.35$. This composition enables to raise refractive index while its phase transition temperature is below a room temperature. In addition, the crystal material is $K_{1-y}Li_yTaO_3$, where composition y is $0 \leq y \leq 0.02$.

In the other aspect, the crystal material is $K_{1-y}Li_yTa_{1-x}Nb_xO_3$, where composition y is $0 \leq y \leq 0.02$. This composition enables a crystal phase transition to be the second order phase transition without latent heat and may settle problems such as a crack formation.

BEST MODES FOR CARRYING OUT THE INVENTION

Embodiments of the present invention will be described in detail with reference to the drawings. The present embodiments are characterized by producing lenses and prisms having composition to be cubic crystal at a room temperature by employing crystal materials of chemical formula $K_{1-y}Li_y Ta_{1-x}Nb_xO_3$ ($0 \leq x \leq 1$, $0 \leq y \leq 1$, hereinafter called KLTN) as optical materials. KLTN has the nature to change a crystal system from a cubic to a tetragonal depend on temperatures. When Li content is in the range of 0-0.02, and Nb content is in the range of 0-0.35, a phase transmission temperature of a cubic to a tetragonal may be set below a room temperature. Therefore, the optical medium without birefringence may be obtained in the usage at a room temperature. Then, the lens and the prism produced by these crystal materials have negligible small polarization dependency of transmitted light.

(KT)

Figure 1:
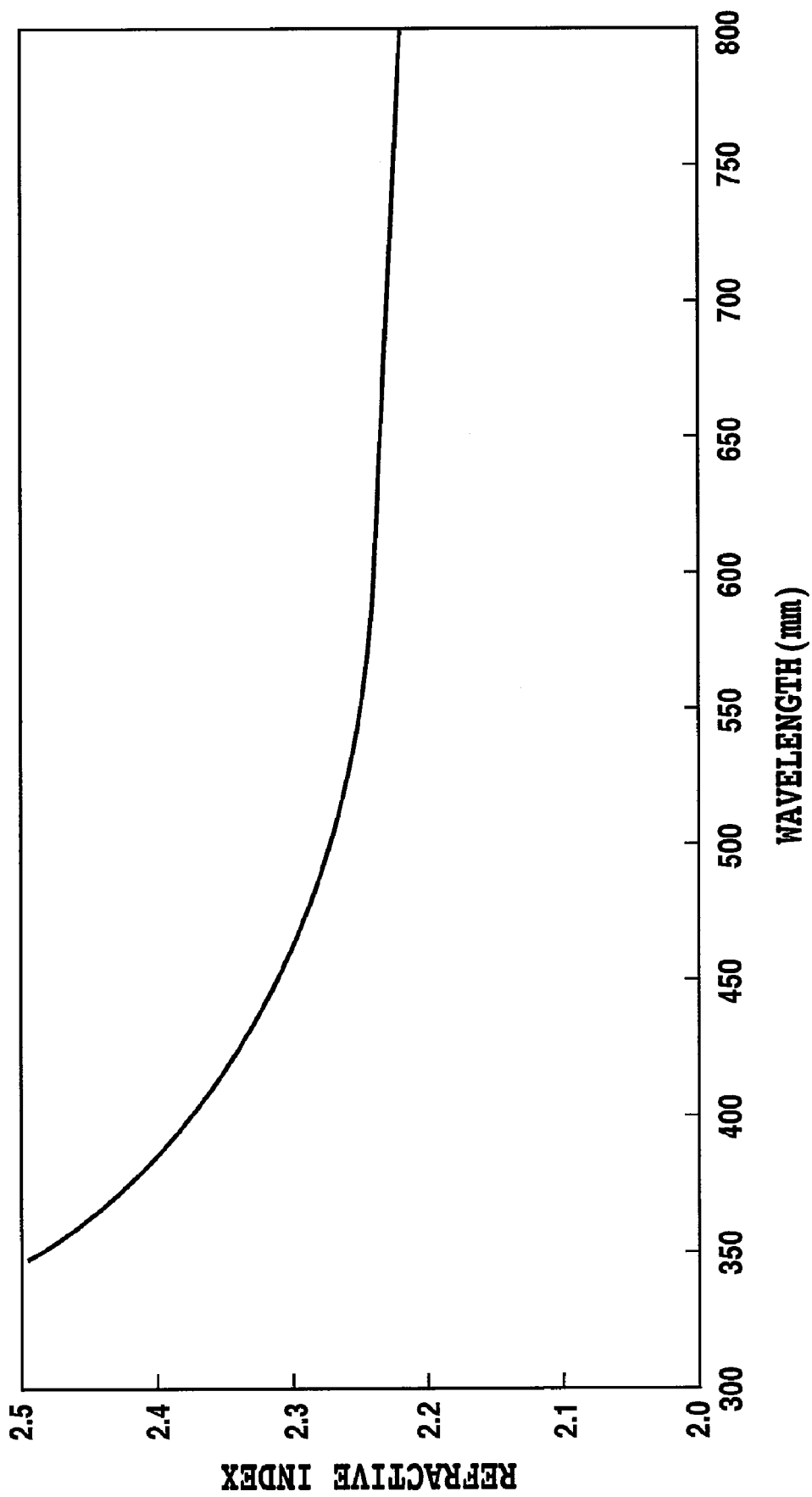
FIG. 1 is a view illustrating wavelength dependence of KT refractive index.
Figure 2:
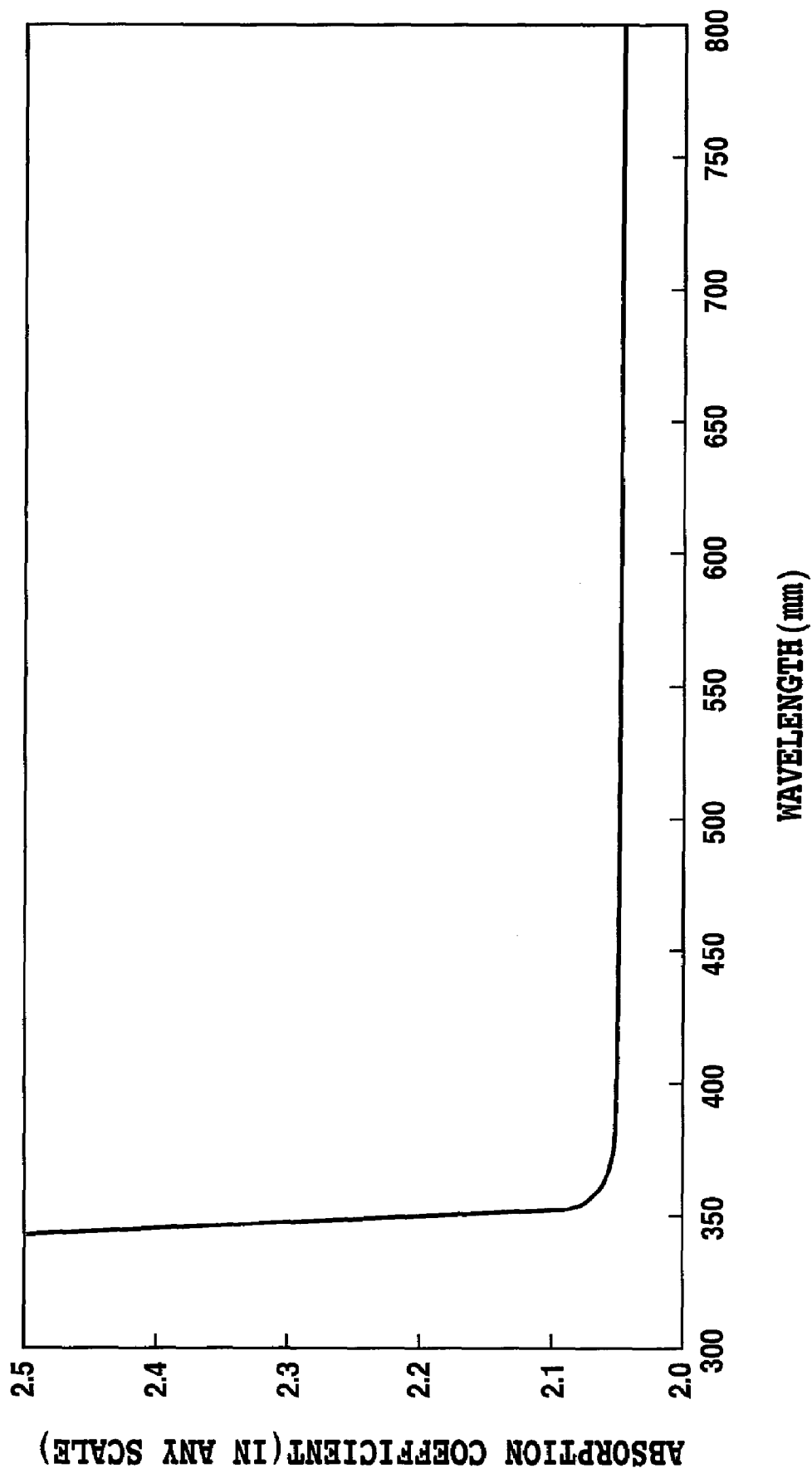
FIG. 2 is a view illustrating optical transmittance of KT.

In the above composition, $KTaO_3$ (x=0, y=0, hereinafter called KT) has a phase transition temperature of approximately −273° C. and crystal materials without birefringence may be obtained in a wide temperature range. In this composition, high refractive indices from 2.2 to 2.4 may be obtained in the visible wavelength band and KT has high performance as optical lenses and prisms. FIG. 1 shows wavelength dependence of KT refractive index, and FIG. 2 shows optical transmittance of KT. $KTaO_3$ has refractive indices of 2.2 or more in the visible wavelength range (400-800 nm), and reaches 2.38 at around 400 nm. In addition, the optical transmittance shown in FIG. 2 has a light absorption edge of approximately 360 nm. It is clear that sufficient light transparency to the short wavelength is maintained. In particular, an optical material with 10 mm-thick has transmittance of 80% or more at around 400 nm.

Figure 3:
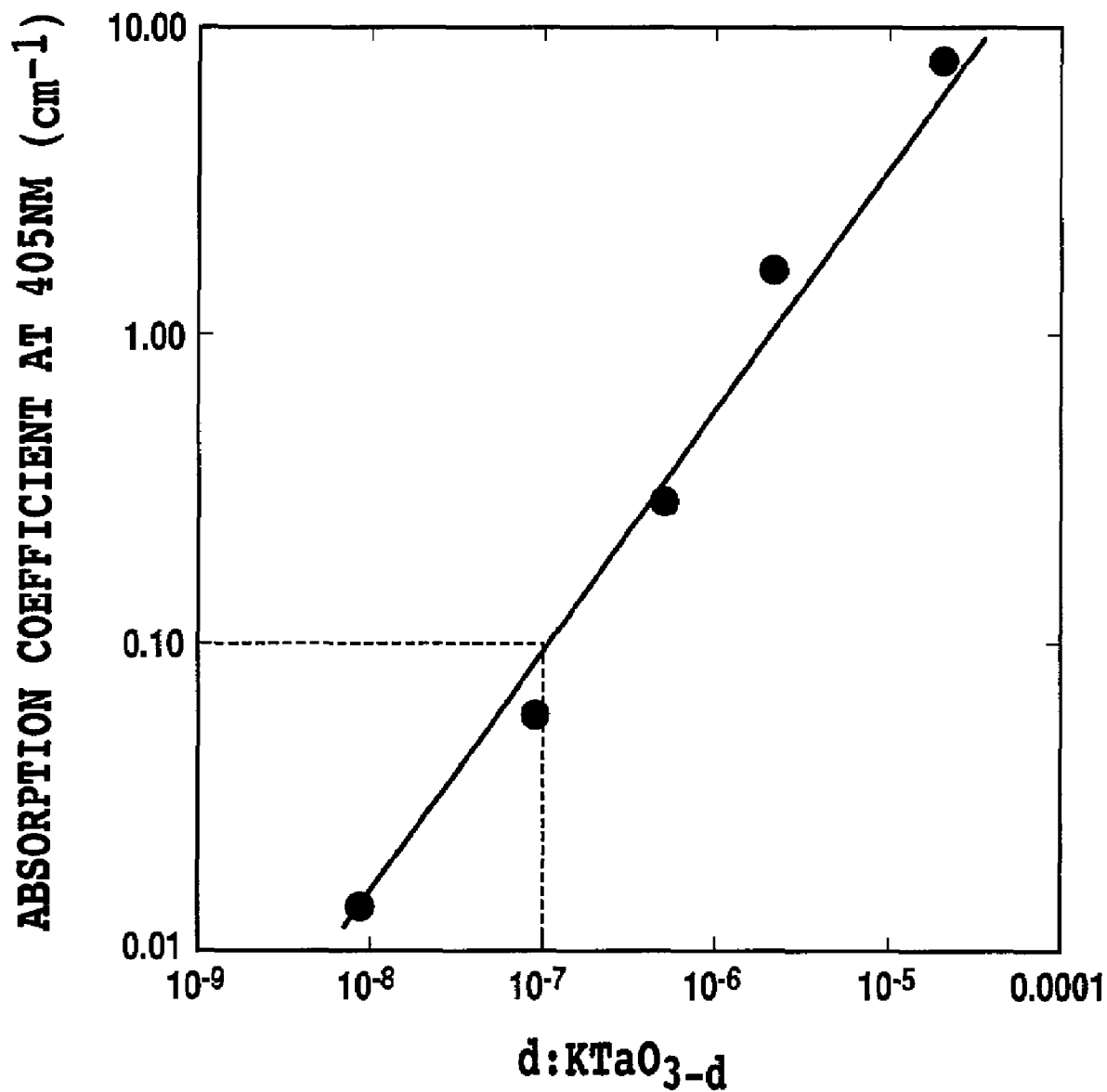
FIG. 3 is a view illustrating the relationship between oxygen deficiency of KT and absorption coefficient at 405 nm.

However, a perovskite oxide has oxygen deficiency easily depending on manufacturing condition and heat treatment condition. The light absorption due to carriers generated by this oxygen deficiency deteriorates optical transmittance. FIG. 3 shows the relationship between oxygen deficiency of KT and an absorption coefficient at 405 nm. When developing $KTaO_3$ crystals, a sample manufactured by changing the oxygen partial pressure in atmosphere is prepared. The amount of oxygen deficiency is measured by increasing weight using thermogravimetric analysis in oxygen atmosphere and an absorption coefficient in the visible wavelength band is measured for every sample. FIG. 3 shows that an absorption coefficient increases with the increase of oxygen deficiency. Considering practicality of a lens and the like, internal optical transmittance of more than 90% per cm is desirable. Thus, it is indispensable that oxygen deficiency of KT below $10^{-7}$ where KT composition is represented as $KTaO_{3-d}$ ($0 \leq d < 10^{-7}$) in that case.

In addition, K included in crystal materials may be replaced with an element at least one of Ba, Sr and Ca, and Ta may be replaced with Ti. Even these crystals may raise refractive index without substantial changes in phase transition temperatures.

(KTN)

Furthermore, in the cases when a high refractive index material is necessary, refractive indices can be raised effectively by adding Nb ($KTa_{1-x}Nb_xO_3$: $0 \leq x \leq 1$, y=0, hereinafter called KTN). However, a phase transition temperature becomes approximately 420° C. at $KNbO_3$ (x=0, y=0) and KTN has birefringence at a room temperature. Therefore, at a room temperature, Nb content has limitation. In particular, the phase transition temperature rises above the room temperature when Nb content exceeds 35% against Ta. Moreover, when a storage temperature and a transport temperature are below the phase transition temperature, crystal materials repeat phase transition even the phase transition temperature is below the room temperature. In this instance, structural change of crystal is accompanied and a factor of reliability degradation such as cracks in crystals occurs. This is because a phase transition is the first order phase transition with latent heat, in KTN composition.

(KLTN)

Consequently, by adding Li, a phase transition is the second order phase transition with no latent heat. This may solve the problem of cracks. Therefore, when a phase transition temperature is low enough compared to a storage temperature and a transport temperature, lenses and prisms composed by KTN have sufficiently high-efficiency and high reliability. In addition, KLTN being added to Li becomes effective, when refractive indices increase and both storage and transport temperatures have approached to a phase transition temperature.

Based on the above, optical lenses and prisms with a high refractive index without birefringence may be realized. The following examples illustrate some preferred modes of the present invention, but are not intended to limit the scope of the claimed invention.

EXAMPLE 1

(Lens Consists of KT Crystals)

KT crystals developed by TSSG method is sliced to 1.2-1.5 mm thickness in [100] direction with a wire saw. The sliced substrate is cut at intervals of 1.2-1.5 mm using the wire saw to produce a cube of 1.2-1.5 mm. By putting this cubic crystal into a container with polishing materials and agitate to round off the corners to produce an almost spherical rough grinded ball. A ball lens having a diameter of 1.0 mm is obtained by putting this rough grinded ball, polishing materials between two grinding substrates and spinning with a constant weight.

A hemispheric lens is obtained by fixing a ball lens on grinding substrates with a wax, and by rotating to grind with a constant weight to smooth one surface. A pickup of a DVD recorder is composed by using this minute hemispheric lens as a SIL.

Figure 4:
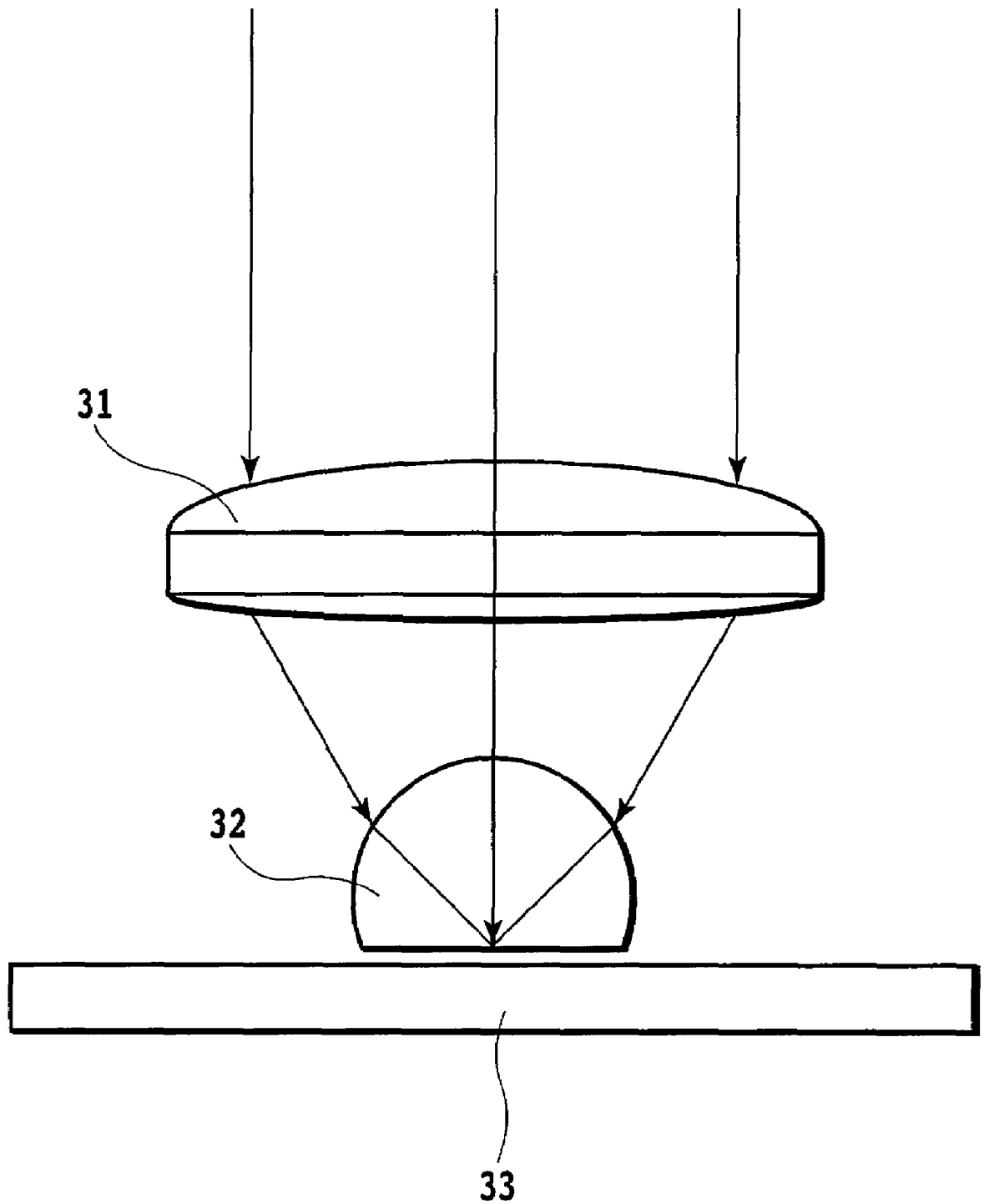
FIG. 4 is a view illustrating a pickup system of DVD recording apparatus.

FIG. 4 shows a composition of the pick-up system of a DVD recorder. The laser beam emitted from a semiconductor laser is focused to a predetermined beam spot diameter through objective lens 31. The emitted laser beam from objective lens 31 is collected at SIL 32 and focused at the bottom of SIL 32. An interval between the recording surface of optical recording medium 33 and the bottom of SIL 32 is set to ¼ or less the light wavelength. The laser beam leaked from SIL 32 reaches optical recording medium 33 at the predetermined beam spot diameter.

The semiconductor laser referenced in Example 1 has a wavelength of 685 nm. The DVD recorder has an objective lens of NA=0.65 and a SIL of KT crystal at a refractive index of 2.23. The recording density of the DVD is measured by an evaluation equipment for DVD recording, the recording density of 19 Gbit/inch$^2$ may be realized. When a conventional high refractive index glass is used for a SIL, a refractive index at 685 nm is 2.0 and a recording density stays at 16 Gbit/inch$^2$.

Therefore, using a lens of which refractive index is higher than that of conventional lenses, high recording density may be realized. Also, according to lens materials described in Example 1, it is clear that the materials have superior in focal power and has no birefringence of materials.

Although the present example describes the semiconductor laser with a 685 nm wavelength, lens materials of the present example are preferred to up to a 360 nm wavelength in focal power. Consequently, a higher density recording is realizable in the short wavelength band. For example, using an evaluation equipment for DVD recording having a semiconductor laser with a 405 nm wavelength and a SIL of NA=2.2, a recording capacity of 150 GB may be realized by applying near-field recording to a 5-inch disk.

EXAMPLE 2

(Lens Consists of KTN Crystals)

Figure 5:
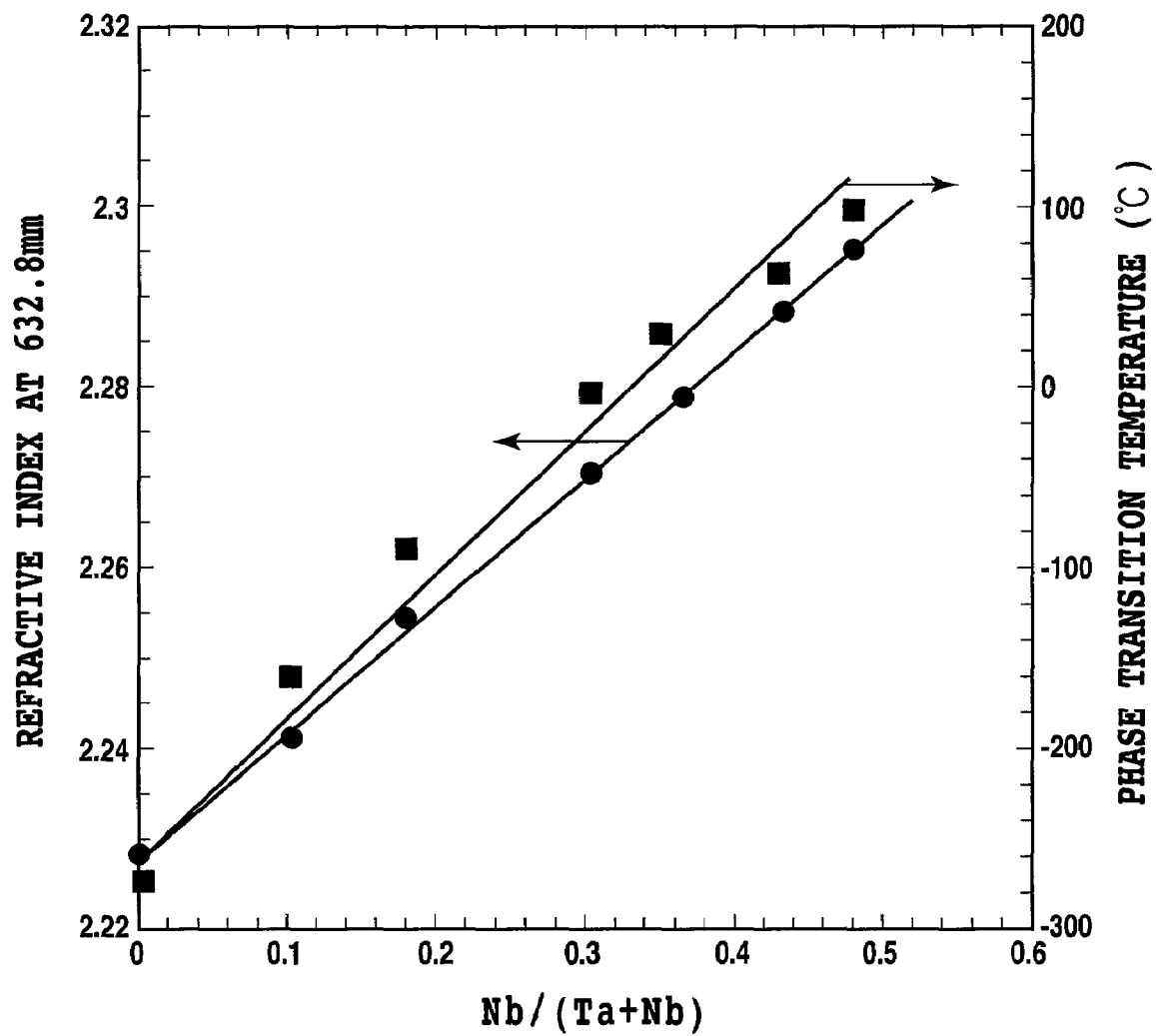
FIG. 5 is a view illustrating the relationship between Nb content x of KTN, refractive indices, and phase transition temperatures.

FIG. 5 shows relationships between Nb content x of KTN, refractive indices and phase transition temperatures. The measurement wavelength is 632.8 nm. Refractive indices rise in proportion to the amount of Nb content, and reach a refractive index of 2.27 at x=0.35. A phase transition temperature and a refractive index rise linearly and reach approximately 25° C. at x=0.35. Consequently, it is clear that Nb content is useful for increasing refractive index, and important to keep Nb content below 0.35 in order to use under the condition without birefringence of crystal.

A SIL is produced as described in Example 1 by using a crystal of Nb content x=0.35. The DVD recorder has an objective lens of NA=0.65, and a SIL of KTN crystal at a refractive index of 2.27. The recording density of the DVD recorder is measured by the evaluation equipment for DVD recording, the recording density of 21 Gbit/inch$^2$ may be realized. In addition, using an evaluation equipment for DVD recording having a semiconductor laser with a 405 nm wavelength and a SIL of NA=2.2, a recording capacity of 160 GB may be realized by applying near-field recording to a 5-inch disk.

Figure 6:
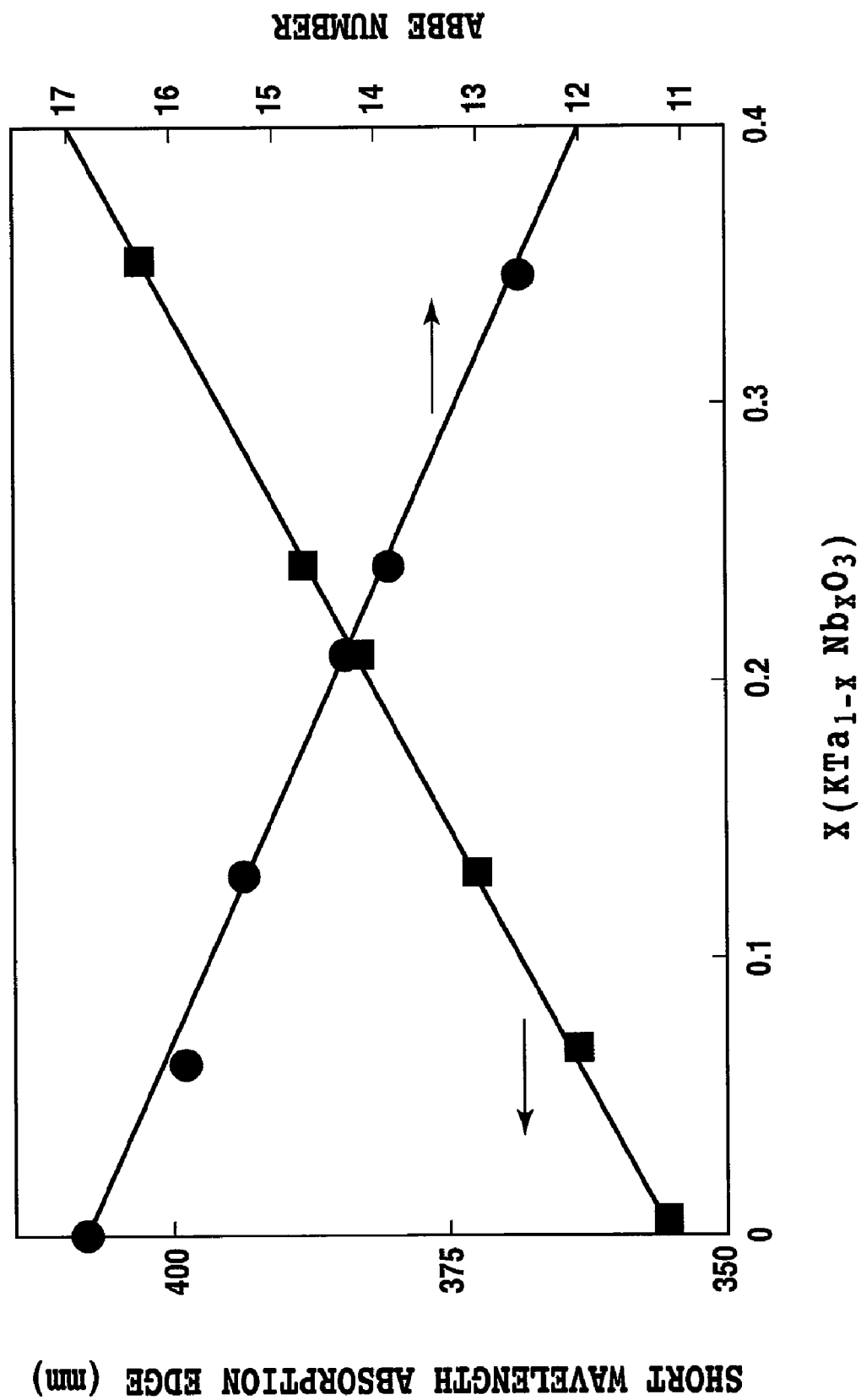
FIG. 6 is a view illustrating the relationship between Nb content x of KTN, short wavelength absorption edges, and Abbe numbers.

Meanwhile, when Nb content exceeds 0.35, a phase transition temperature of crystals approaches a room temperature. Then, a phase transition to tetragonal easily occurs in association with external influences such as pressure to crystals, so that optically isotropic materials are not obtained. In addition, light transmission characteristics deteriorate and a wavelength absorption edge becomes 400 nm. Therefore, when the amount of Nb content becomes 0.35 or more, it is possible to make a lens of NA increased, but optical homogeneity and transmission characteristics are not acquired practically. FIG. 6 shows the relationships between Nb content x of KTN, short wavelength absorption edges and Abbe numbers. As refractive indices of crystal containing a high proportion of Nb get higher, dispersion become significant, and a light absorption edge shifts to the long wavelength side. Moreover, refractive index dispersion becomes significant as a light absorption edge shifts to the long wavelength side, that is, Abbe number becomes small. KTN materials become a high refractive index and high dispersion by addition of Nb.

Figure 7:
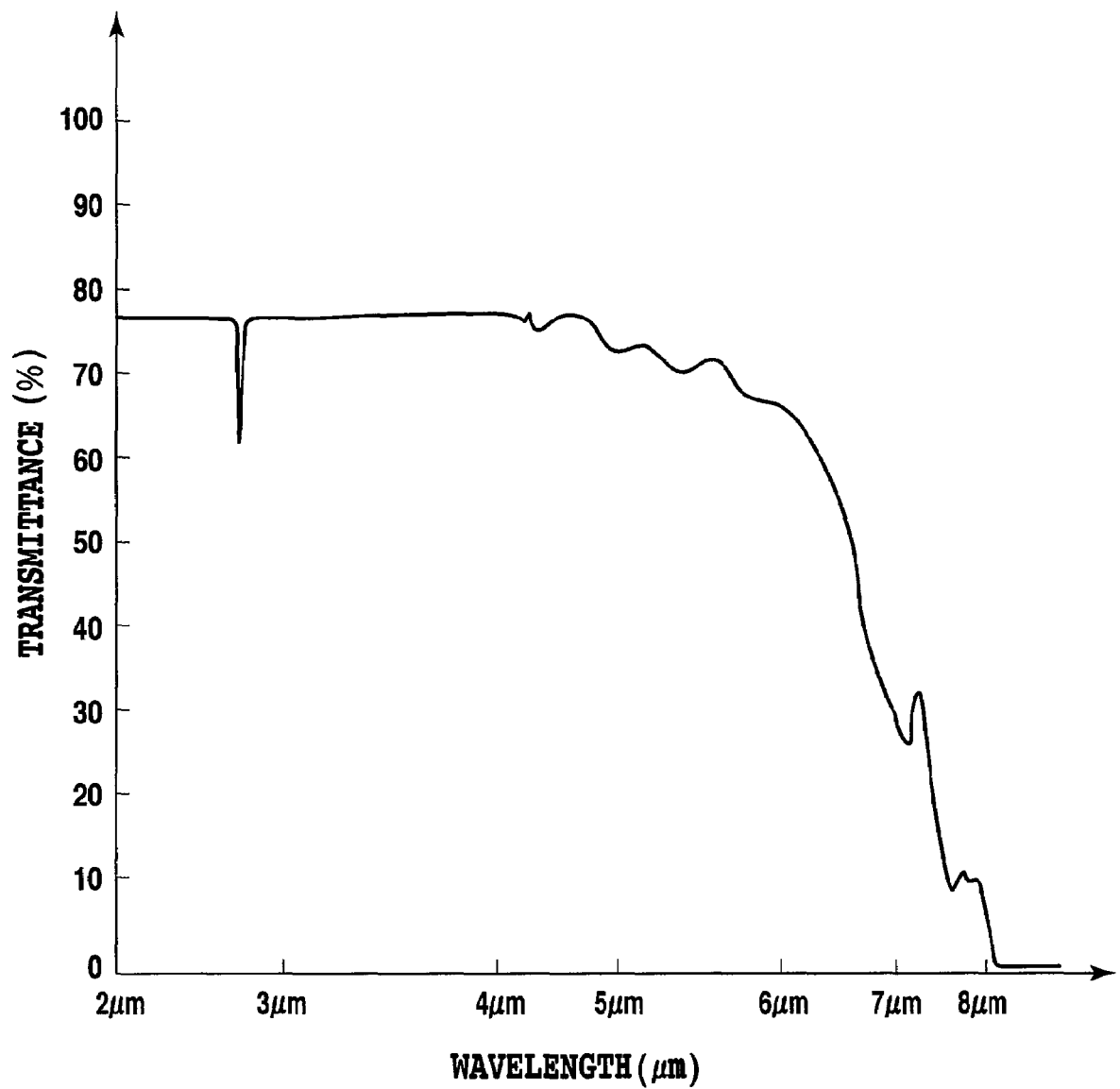
FIG. 7 is a view illustrating a spectrum of KTN at the long wavelength band.

FIG. 7 shows a long wavelength side spectrum of KTN. Since transmittance of the vertical axis includes reflection of crystal to the both sides, it is not an internal transmittance. For example, an internal transmittance at 4 μm is 100%. Thus, KTN crystals are free from absorption up to a 5 μm wavelength and has a high refractive index. That is to say, it may be applied to a lens and a prism in the infrared region.

EXAMPLE 3

(KLT)

By adding Li to KT, a crystal growth temperature can be lowered and the amount of evaporation of K$_2$O in the crystal growth process can be reduced. If K$_2$O evaporate, it condenses in low temperature area of the upper crystal manufacturing device. If the amount of condensates increases, it will drop in crucible. The drop of the condensates constricts steady growth of crystal since a junk-crystal including the condensates as a core floats in a solution. Therefore, by adding Li to KT, growing in size crystal, improvement in the yield and cost-reduction of lens may be realized.

By adding Li$_2$CO$_3$ in the solution of KT, K$_{1-y}$Li$_y$TaO$_3$ (0≦y≦0.02, hereinafter called KLT) crystal is prepared. Composition y is stated 0.02 or less because it is impossible to maintain cubic crystal at y>0.02. On this occasion, the amount of Li$_2$CO$_3$ against K$_2$CO$_3$ is 18 mol %. The refractive index of KLT against composition y at 405 nm is stated as follow.

$$n(@405\ nm)=2.353-0.19y$$

As is clear from this formula, a crystal refractive index is decreased with addition of Li. However, the decrease is only about 0.0038 when the maximum addition of Li is at 0.02 and practically acceptable. On the other hand, a crystal growth temperature may be lowered, as mentioned above, which leads to yield improvement by 20%.

EXAMPLE 4

Figure 8:
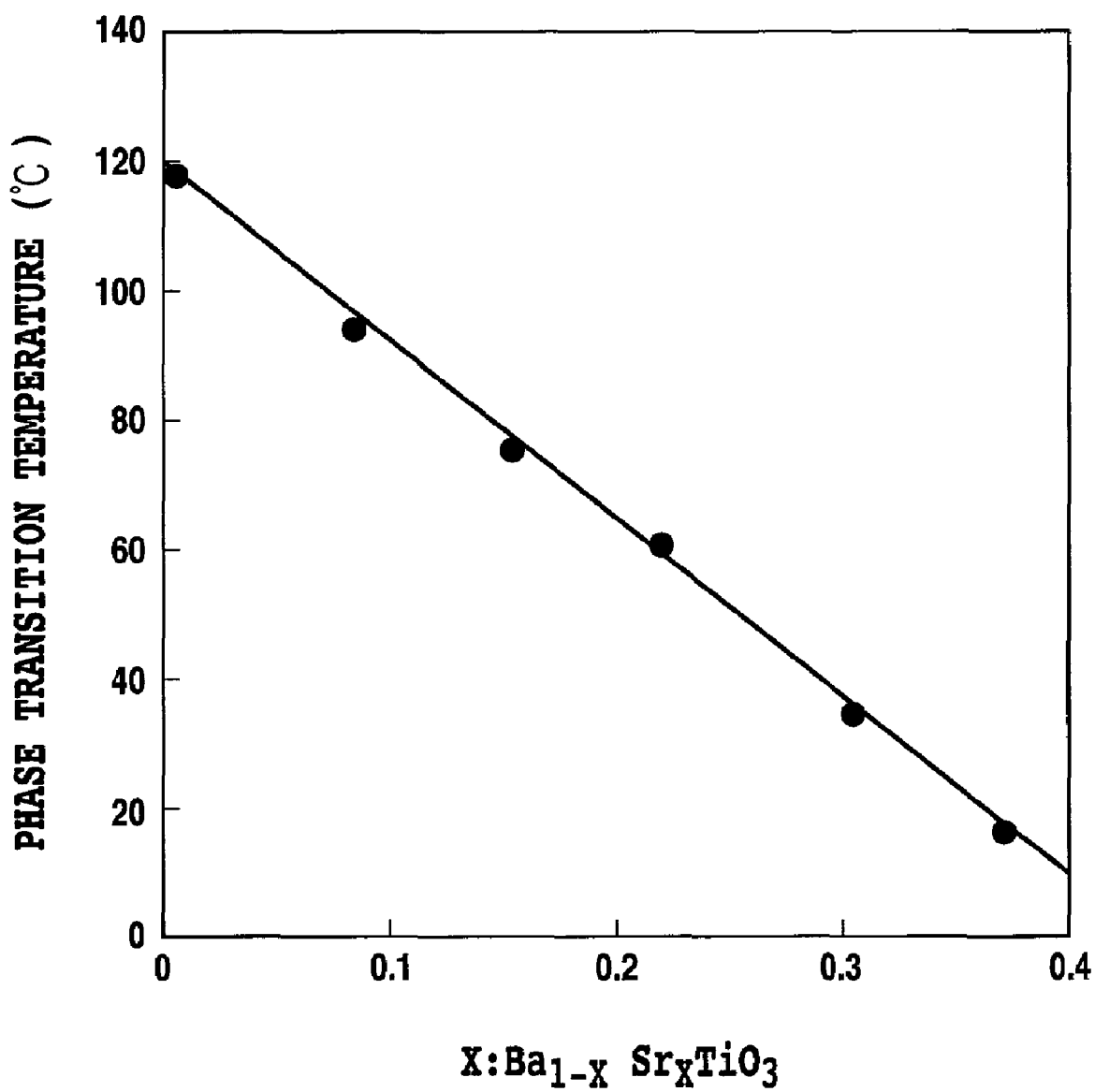
FIG. 8 is a view illustrating the relationship between Sr content x and phase transition temperatures.

In regard to crystal materials described in Example 1, BaTiO$_3$, which K is replaced to Ba and Ta is replaced to Ti, has a phase transition temperature of 120° C. Consequently, as crystal materials described in Example 3, Ba$_{1-x}$Sr$_x$TiO$_3$ (0.34≦x≦1) with which Li is replaced to Sr is produced. FIG. 8 shows the relationship between Sr content x and phase transition temperatures. As Sr content increases, a phase transition temperature from cubic to tetragonal decreases. In order to keep cubic crystal at a room temperature, a phase transition temperature is desired to maintain below a room temperature, and composition x is desired to be over 0.34, as shown in FIG. 8.

EXAMPLE 5

(KLTN)

As shown in FIG. 5, when Nb content is over 0.2, a phase transition temperature exceeds −100° C. Therefore, a storage temperature and a transport temperature may get lower than a phase transition temperature. Then, a phase transition of crystal materials is repeated and a crack forms. To avoid the crack, KLTN of Li content y=0.01 is employed.

Crystals of Nb content x=0.35 are produced, and a temperature cycle of −45° C. to +60° C. is performed. Accordingly, crystals without Li had minute crack in 2-3 samples out of 100 samples, after 1000 cycles. On the other hand, no cracks were found in crystals with Li content y=0.01.

EXAMPLE 6

(Prism Consists of KT Crystals)

Figure 9:
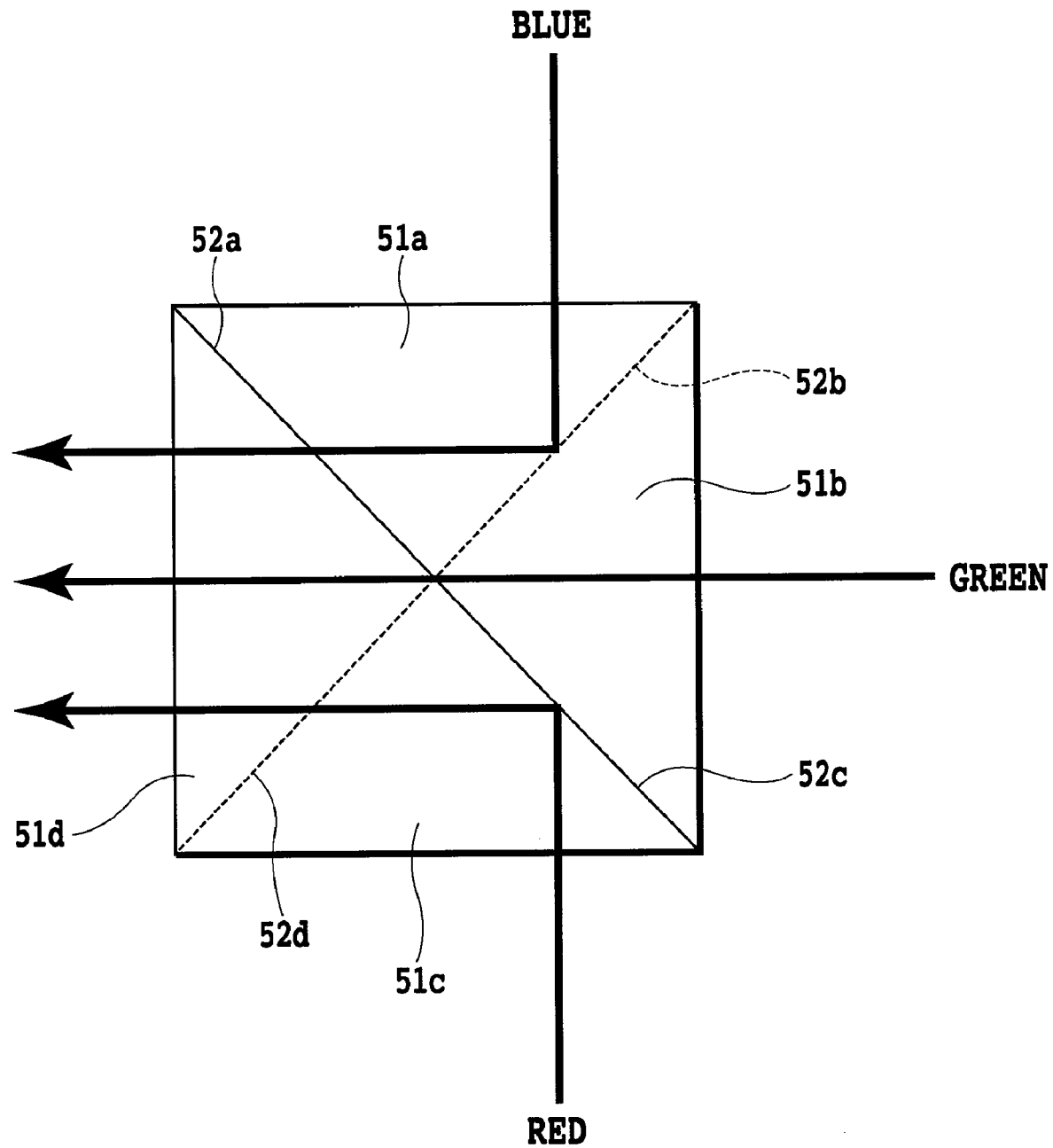
FIG. 9 is a view illustrating the composition of a cross-dichroic prism according to one embodiment of the present invention.

FIG. 9 shows the composition of a cross-dichroic prism according to one embodiment of the present invention. By use of same constituent of KT crystal as Example 1, four triangular prisms 51a-51d employed in the 3 CCD-color separation/composition optical system are produced. Conventional polishing technique is performed for the production. Dielectric multilayer film coatings are performed on right-angled side of triangular prisms 51a-51d. Each right-angled side of triangular prisms 51a-51d is joined. On the right-angled side 52a, 52c, which is one of the diagonal lines of the cross-section of the joined quadrangular prism, a multilayer film which reflects R signal of RGB signal and transmits G signal and B signal is attached. On the other diagonal lines as right-angled side 52b, 52d, a multilayer film which reflects B signal and transmits R signal and G signal is attached. Thus, a cross-dichroic prism used for the 3 CCD-color separation/composition optical system separates into RGB signals, modulates each signal and combines the modulated signals.

This cross-dichroic prism is installed in a projector. A light source project an image by using an extra-high-pressure mercury lamp, a metal halide lamp or a high-power xenon lamp with a high-intensity of 2000 lumens. The cross-dichroic prism described in the present example has an irradiation intensity of 2.2 W/cm², and has a transmission deterioration of 1% or less under a 10-minute irradiation. Therefore, the projected image of the projector has no luminance transition over an extended period of time and is able to maintain image of high color rendering properties. This way, KT crystal has high optical tolerance, high homogeneity, and high light transmission characteristics, hence the cross-dichroic prism which employs these materials may be applied to an imaging device of high light input such as projectors.

EXAMPLE 7

(Prism Comprising KTN Crystal)

The cross-dichroic prism as described in Example 6 is produced by using the KTN crystals described in Example 2. It is applied to the projector which constitutes the 3 CCD-color separation/composition optical system, as described in Example 6. In a prism with Nb content, optical transmission characteristics and optical tolerance do not deteriorate. The projector can project images of the stable high luminosity as Example 6. Even when KTLN crystals with Li content are used, the cross-dichroic prism can maintain sufficient characteristics.

EXAMPLE 8

(Polycrystalline Material)

Although the crystal materials mentioned in the above Examples use single crystal materials, polycrystalline materials may also produce optical medium having a high refractive index without anisotropy and a wide transmission wavelength range. The producing method of polycrystalline KT is described in the following. After mixing powders of $K_2CO_3$ and $Ta_2O_5$ as raw materials with a ratio of 1:1, they will be heated for 10 hours in an oxygen environment at 1,000° C. inside a platinum container. $KTaO_3$ is formed with an elimination reaction of $CO_2$ by heating. After grounding lightly the formed $KTaO_3$ powder, the $KTaO_3$ powder is mixed with KF powder and heated for 5 hours in an oxygen environment at 700° C. $K_2TaO_3F$ is formed by solid-phase reaction by heating. $K_2TaO_3F$ is dissolved in water and stayed for 12 hours after heating at 80° C. By agitating a solution, water is evaporated, and sediments are collected by filtration after verifying sedimentation in the solution. At this time, aqueous washing repeats and then HF components are removed. The produced powder is micronized $KTaO_3$ powder and an average particle diameter is about 10 μm.

The pressure of 5 kg/mm² is applied to the micronized $KTaO_3$ powder by an uniaxial pressing machine. Then, a pellet with a 30 mm diameter and a thickness of 10 mm is molded. After putting this pellet into a platinum container and covering with the micronized $KTaO_3$ powder, it is heated for 10 hours in an oxygen environment at 1000° C. in an electric furnace. After natural cooling, a transparent pellet which shrinks by sintering to a 20 mm diameter and a 6 mm thickness is taken out. The pellet is covered with the same constituent powder, in order to inhibit $K_2O$ to evaporate from the pellet surface. The vapor pressure of $K_2O$ may be kept above the equilibrium vapor pressure by putting powder materials containing $K_2O$ inside the electric furnace.

The obtained pellet is examined under a microscope to find that it is a polycrystal with an average crystal grain of 50-100 μm. Optical transmittance and a refractive index of the pellet is almost the same as the above-referenced KT, and birefringence of the pellet is below the measuring limit. A SIL is produced as described in Example 1 by quarrying 1.2 mm cube from this pellet. When a recording density is estimated by the evaluation equipment for DVD recording, the recording density equals to that of the DVD recorder as described in Example 1. Since a crystal material is a cubic crystal, an optically isotopic lens may be produced by either of single crystal materials or polycrystalline materials.

Although a powder production method with a solid-phase reaction is described in Example 8, a powder production method such as a sol-gel method, a coprecipitation method and the like may be used. Also, in order to suppress oxygen deficiency of crystal materials as possible, an oxygen environment for sintering or an oxygen environment which partial pressure of oxygen is greater than equilibrium partial pressure is desirable.

By adding $Nb_2O_5$ in the process of producing polycrystalline materials, polycrystalline materials of KTN may be produced. A polycrystalline KTN has optically isotropic characteristics and a sintered density reaches almost 100% without defects such as a void.

The invention claimed is:

1. An optical medium comprising a cubic crystal comprising $KTaO_{3-d}$, where the amount of oxygen deficiency d is $10^{-8} \leq d < 10^{-7}$ controlled based on a monotonically increasing relationship between the oxygen deficiency and an absorption coefficient.

2. An optical lens comprising:
   a cubic crystal material comprising $KTaO_{3-d}$, where the amount of oxygen deficiency d is $10^{-8} \leq d < 10^{-7}$ controlled based on a monotonically increasing relationship between the oxygen deficiency and an absorption coefficient; and a refractive index of more than 2.2 in the wavelength range of 360 nm-800 nm, and a transmission of 80% or more with a 10 mm thickness.

3. An optical prism comprising:

a cubic crystal material comprising $KTaO_{3-d}$, where the amount of oxygen deficiency d is $10^{-8} \leq d < 10^{-7}$ controlled based on a monotonically increasing relationship between the oxygen deficiency and an absorption coefficient; and a refractive index of more than 2.2 in the wavelength range of 360 nm-800 nm, and a transmission deterioration of 1% or less under a 10-minute irradiation with an irradiation intensity of 2.2 W/cm$^2$.

* * * * *